US012587184B2

(12) United States Patent
Liu et al.

(10) Patent No.: US 12,587,184 B2
(45) Date of Patent: Mar. 24, 2026

(54) OUTPUT BUFFER THAT CAN PREVENT DRAIN-SOURCE VOLTAGE OF TRANSISTOR FROM BRIEFLY EXCEEDING NOMINAL VOLTAGE

(71) Applicant: Faraday Technology Corp., Hsin-Chu City (TW)

(72) Inventors: Zhou-Lun Liu, Hsin-Chu City (TW); Jeng-Huang Wu, Hsin-Chu City (TW); Chih-Hung Wu, Hsin-Chu City (TW); Meng-Yuan Chen, Hsinchu City (TW)

(73) Assignee: Faraday Technology Corp., Hsin-Chu City (TW)

( * ) Notice: Subject to any disclaimer, the term of this patent is extended or adjusted under 35 U.S.C. 154(b) by 0 days.

(21) Appl. No.: 18/827,840

(22) Filed: Sep. 8, 2024

(65) Prior Publication Data

US 2025/0364985 A1     Nov. 27, 2025

(30) Foreign Application Priority Data

May 22, 2024     (TW) ................................. 113118927

(51) Int. Cl.
   *H03K 17/10*          (2006.01)
(52) U.S. Cl.
   CPC .................................. *H03K 17/102* (2013.01)

(58) Field of Classification Search
   CPC .................................................... H03K 17/6872
   USPC ........................................................... 327/306
   See application file for complete search history.

(56) References Cited

U.S. PATENT DOCUMENTS

| | | | |
|---|---|---|---|
| 6,097,237 A | 8/2000 | Singh | |
| 2019/0305778 A1* | 10/2019 | Chen ................. | H03K 17/6872 |

FOREIGN PATENT DOCUMENTS

| | | |
|---|---|---|
| TW | 200701641 | 1/2007 |
| TW | I345375 | 7/2011 |

* cited by examiner

Primary Examiner — Tomi Skibinski
(74) Attorney, Agent, or Firm — Winston Hsu

(57)          ABSTRACT
An output buffer includes a first P-type transistor, a second P-type transistor, a first N-type transistor, a second N-type transistor, a control circuit, and a tracking circuit. The second P-type transistor and the first P-type transistor are coupled between a supply voltage and a pad, and the second N-type transistor and the first N-type transistor are coupled between a ground voltage and the pad. The control circuit is arranged to generate two first gate control signals according to a control signal for controlling the first P-type transistor and the first N-type transistor. The tracking circuit is coupled to the pad, and is arranged to generate a second gate control signal according to the output signal for controlling the second P-type transistor or the second N-type transistor.

9 Claims, 8 Drawing Sheets

OUTPUT BUFFER THAT CAN PREVENT DRAIN-SOURCE VOLTAGE OF TRANSISTOR FROM BRIEFLY EXCEEDING NOMINAL VOLTAGE

BACKGROUND OF THE INVENTION

1. Field of the Invention

The present invention is related to an output buffer, and more particularly, to an output buffer that can prevent a drain-source voltage of a transistor from briefly exceeding a nominal voltage.

2. Description of the Prior Art

With the evolution of semiconductor manufacturing processes, transistor sizes are becoming smaller and smaller, resulting in the decrease in a nominal voltage of the transistor. When designing an output buffer of a general purpose input/output (GPIO), since a supply voltage of an interface circuit may be greater than the nominal voltage of the transistor, a stacked transistor may be utilized in the output buffer in order to avoid damage to the transistor therein due to a high supply voltage.

FIG. 1 is a diagram illustrating an output buffer 100. As shown in FIG. 1, the output buffer 100 includes two P-type transistors PM1 and PM2, two N-type transistors NM1 and NM2, and a pad 102. Assume that a supply voltage VDD of the output buffer 100 is 3.3V, and each nominal voltage of the P-type transistors PM1 and PM2 and the N-type transistors NM1 and NM2 is 1.8V. In this situation, gate terminals of the P-type transistor PM2 and the N-type transistor NM2 will be fixedly applied with a reference voltage of about 1.8V, such that a drain-source voltage of the transistor will not exceed the nominal voltage.

When the output buffer 100 performs output voltage level switching (i.e., an output of the pad 102 is switched from 3.3V to 0V, or is switched from 0V to 3.3V), the drain-source voltage of the P-type transistor PM2 or the drain-source voltage of the N-type transistor NM2 may exceed its nominal voltage in a short period of time. Over time, gate oxide breakdown or hot carrier injection may occur, thus affecting the reliability of the transistor.

Specifically, when the output buffer 100 outputs 3.3V, a front-end driving circuit may generate and transmit a gate control signal of 1.8V to the P-type transistor PM1, and generate and transmit a gate control signal of 0V to the N-type transistor NM1. At this moment, the P-type transistors PM1 and PM2 are enabled to be turned on, and the N-type transistors NM1 and NM2 are disabled to be turned off. During a process of the output of the output buffer 100 being switched from 3.3V to 0V, the front-end driving circuit may generate a gate control signal in order to make a gate voltage of the P-type transistor PM1 increase from 1.8V to 3.3V, and generate a gate control signal in order to make a gate voltage of the N-type transistor NM1 increase from 0V to 1.8V. During a process of the gate voltage of the N-type transistor NM1 increasing from 0V to 1.8V, since the N-type transistor NM2 will be turned on until the voltage of a node N1 decreases to a lower voltage level (e.g., until the voltage of the node N1 is lower than (1.8V−Δ), wherein Δ is a threshold value of the N-type transistor NM2), the drain-source voltage of the N-type transistor NM2 may exceed its nominal voltage in this short period of time. Similarly, during a process of the output of the output buffer 100 being switched from 0V to 3.3V, the drain-source voltage of the P-type transistor PM2 may also briefly exceed its nominal voltage. In the long run, the reliability of the transistor may be affected.

SUMMARY OF THE INVENTION

It is therefore one of the objectives of the present invention to provide an output buffer that can prevent a drain-source voltage of a transistor from briefly exceeding a nominal voltage, in order to address the above-mentioned issues.

According to an embodiment of the present invention, an output buffer is provided. The output buffer comprises a first P-type transistor, a second P-type transistor, a first N-type transistor, a second N-type transistor, a control circuit, and a tracking circuit. The first P-type transistor is coupled to a supply voltage. The second P-type transistor is coupled between the first P-type transistor and a pad, wherein the first P-type transistor and the second P-type transistor selectively connect the supply voltage and the pad, and the pad is arranged to output an output signal of the output buffer. The first N-type transistor is coupled to a grounding voltage. The second N-type transistor is coupled between the first N-type transistor and the pad, wherein the first N-type transistor and the second N-type transistor selectively connect the grounding voltage and the pad. The control circuit is arranged to generate two first gate control signals according to a control signal, in order to control the first P-type transistor and the first N-type transistor. The tracking circuit is coupled to the pad, and is arranged to generate a second gate control signal according to the output signal, in order to control the second P-type transistor or the second N-type transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
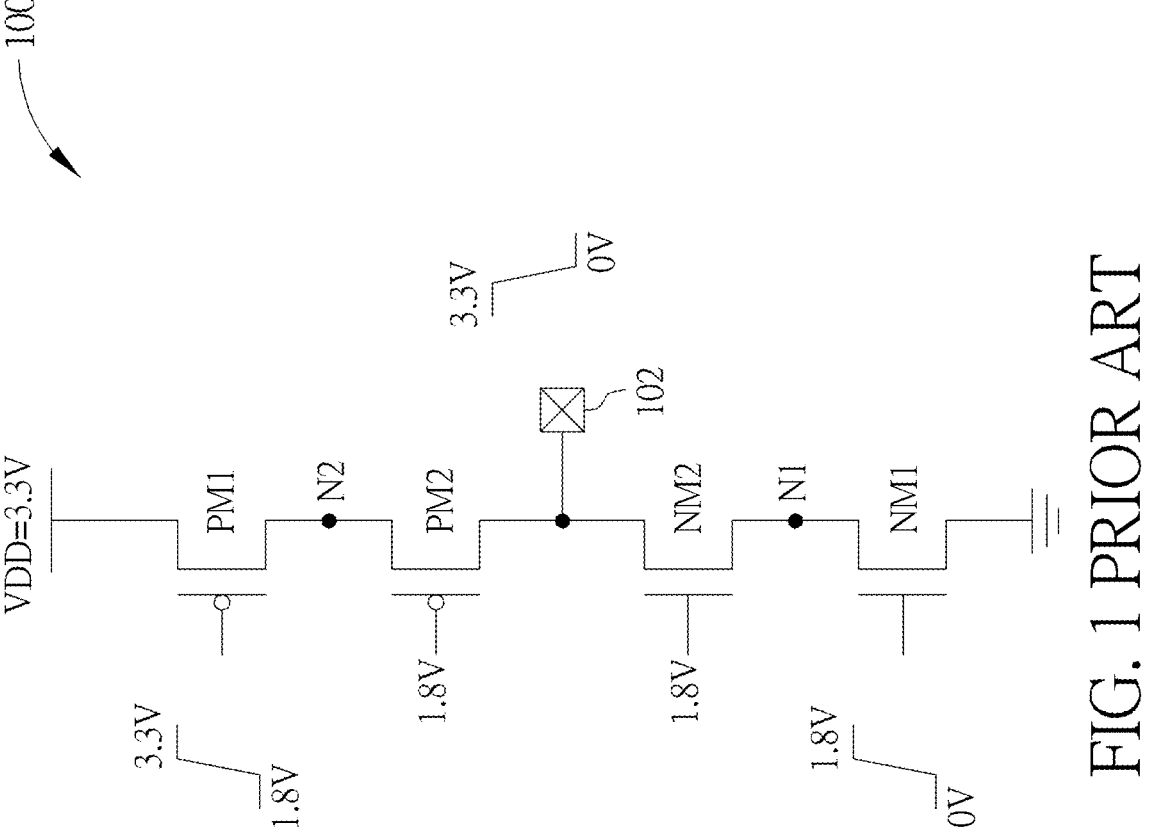
FIG. 1 is a diagram illustrating an output buffer.
Figure 2:
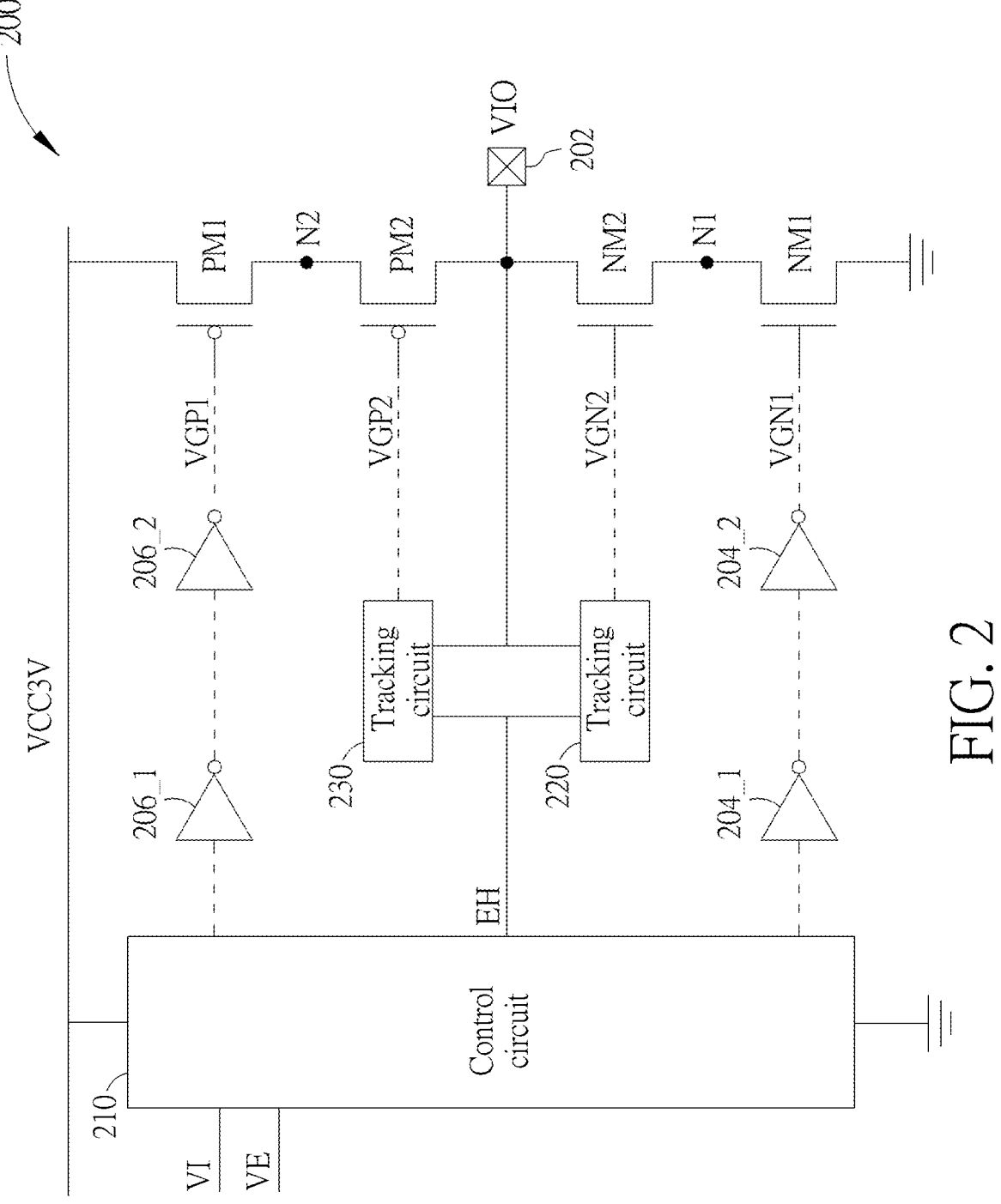
FIG. 2 is a diagram illustrating an output buffer according to an embodiment of the present invention.

FIG. 2 is a diagram illustrating an output buffer 200 according to an embodiment of the present invention. As shown in FIG. 2, the output buffer 200 includes a control circuit 210, multiple tracking circuits 220 and 230, multiple inverters 204_1, 204_2, 206_1, and 206_2, multiple P-type transistors PM1 and PM2, multiple N-type transistors NM1 and NM2, and a pad 202. In this embodiment, each of the P-type transistors PM1 and PM2 is a P-type Metal Oxide Semiconductor Field Effect Transistor (MOSFET), and each of the N-type transistors NM1 and NM2 is an N-type MOSFET, wherein a source terminal of the N-type transistor NM1 is coupled to a grounding voltage, and a drain terminal of the N-type transistor NM1 is coupled to a node N1; a source terminal of the N-type transistor NM2 is coupled to the node N1, and a drain terminal of the N-type transistor NM2 is coupled to the pad 202; a source terminal of the P-type transistor PM1 is coupled to a supply voltage VCC3V, and a drain terminal of the P-type transistor PM1 is coupled to a node N2; and a source terminal of the P-type transistor PM2 is coupled to the node N2, and a drain terminal of the P-type transistor PM2 is coupled to the pad 202.

The supply voltage VCC3V is greater than a nominal voltage of each of the P-type transistors PM1 and PM2 and the N-type transistors NM1 and NM2. For better comprehension, assume that the supply voltage VCC3V is 3.3V, and the nominal voltage is 1.8V, but the present invention is not limited thereto.

The control circuit 210 receives control signals VI and VE and generates gate control signals VGP1 and VGN1 and a control signal EH according to the control signals VI and VE, wherein the gate control signals VGP1 and VGN1 control the P-type transistor PM1 and the N-type transistor NM1, respectively, in order to determine an output signal VIO of the output buffer 200. In this embodiment, the control signal VE indicates whether the output buffer 200 operates in an output mode, and the control signal VI controls the output buffer 200 to output a high voltage or a low voltage (e.g., 3.3V or 0V). When the control signal VE is equal to "1", the output buffer 200 operates in the output mode and generates and transmits the output signal VIO to an external circuit. At this moment, if the control signal VI corresponds to a logical value "0" (e.g., a low voltage level), the control circuit 210 generates the gate control signals VGP1 and VGN1 for turning off the P-type transistor PM1 and turning on the N-type transistor NM1, so that the output signal VIO has a low voltage (e.g., 0V). If the control signal VI corresponds to a logical value "1" (e.g., a high voltage level), the control circuit 210 generates the gate control signals VGP1 and VGN1 for turning on the P-type transistor PM1 and turning off the N-type transistor NM1, so that the output signal VIO has a high voltage (e.g., 3.3V). In addition, the control signal EH controls the tracking circuits 220 and 230 to adapt to different operating modes, and is an optional control signal.

The tracking circuit 220 is arranged to track a voltage level of the output signal VIO, and selectively output a reference voltage or the output signal VIO as a gate control signal VGN2 in order to control the N-type transistor NM2, wherein a voltage level of the reference voltage may be any suitable value between the supply voltage VCC3V and the grounding voltage that is close to a middle value of the supply voltage VCC3V and the grounding voltage, such as 1.8 V. The tracking circuit 230 is arranged to track the voltage level of the output signal VIO, and selectively output the reference voltage or the output signal VIO as a gate control signal VGP2 in order to control the P-type transistor PM2.

Under a general situation, the gate control signal VGN2 may be equal to the voltage level of the reference voltage (e.g., 1.8V). When the control signal VI is changed from the logical value "1" to the logical value "0", the control circuit 210 may generate the gate control signals VGP1 and VGN1 in order to turn off the P-type transistor PM1 and turn on the N-type transistor NM1. At this moment, the tracking circuit 220 may selectively regard the output signal VIO as the gate control signal VGN2 according to the voltage level of the output signal VIO, in order to increase the voltage level of the gate control signal VGN2 (e.g., the voltage level of the gate control signal VGN2 may briefly increase to a voltage level close to 3.3V). Since the voltage level of the gate control signal VGN2 increases to the voltage level close to 3.3V, the N-type transistor NM2 may be quickly turned on without pulling a voltage level at the node N1 down to a lower voltage level. In addition, the reference voltage is regarded as the gate control signal VGN2 after the voltage level of the output signal VIO decreases, so that the drain-source voltages of the N-type transistors NM1 and NM2 will not be greater than the nominal voltage. As mentioned above, the tracking circuit 220 may prevent the drain-source voltage of the N-type transistor NM2 from briefly exceeding the nominal voltage, in order to avoid the gate oxide breakdown or the hot carrier injection.

Under a general situation, the gate control signal VGP2 may be equal to the voltage level of the reference voltage (e.g., 1.8V). When the control signal VI is changed from the logical value "0" to the logical value "1", the control circuit 210 may generate the gate control signals VGP1 and VGN1 in order to turn on the P-type transistor PM1 and turn off the N-type transistor NM1. At this moment, the tracking circuit 230 may selectively regard the output signal VIO as the gate control signal VGP2 according to the voltage level of the output signal VIO, for decreasing the voltage level of the gate control signal VGP2 (e.g., the voltage level of the gate control signal VGP2 may briefly decrease to 0V). Since the gate control signal VGP2 decreases to 0V, the P-type transistor PM2 may be quickly turned on without increasing a voltage level at the node N2 to a higher voltage level. In addition, the reference voltage is regarded as the gate control signal VGP2 after the voltage level of the output signal VIO increases, so that the drain-source voltages of the P-type transistors PM1 and PM2 will not be greater than the nominal voltage. As mentioned above, the tracking circuit 230 may prevent the drain-source voltage of the P-type transistor PM2 from briefly exceeding the nominal voltage, such that the gate oxide breakdown or the hot carrier injection can be avoided.

Figure 3:
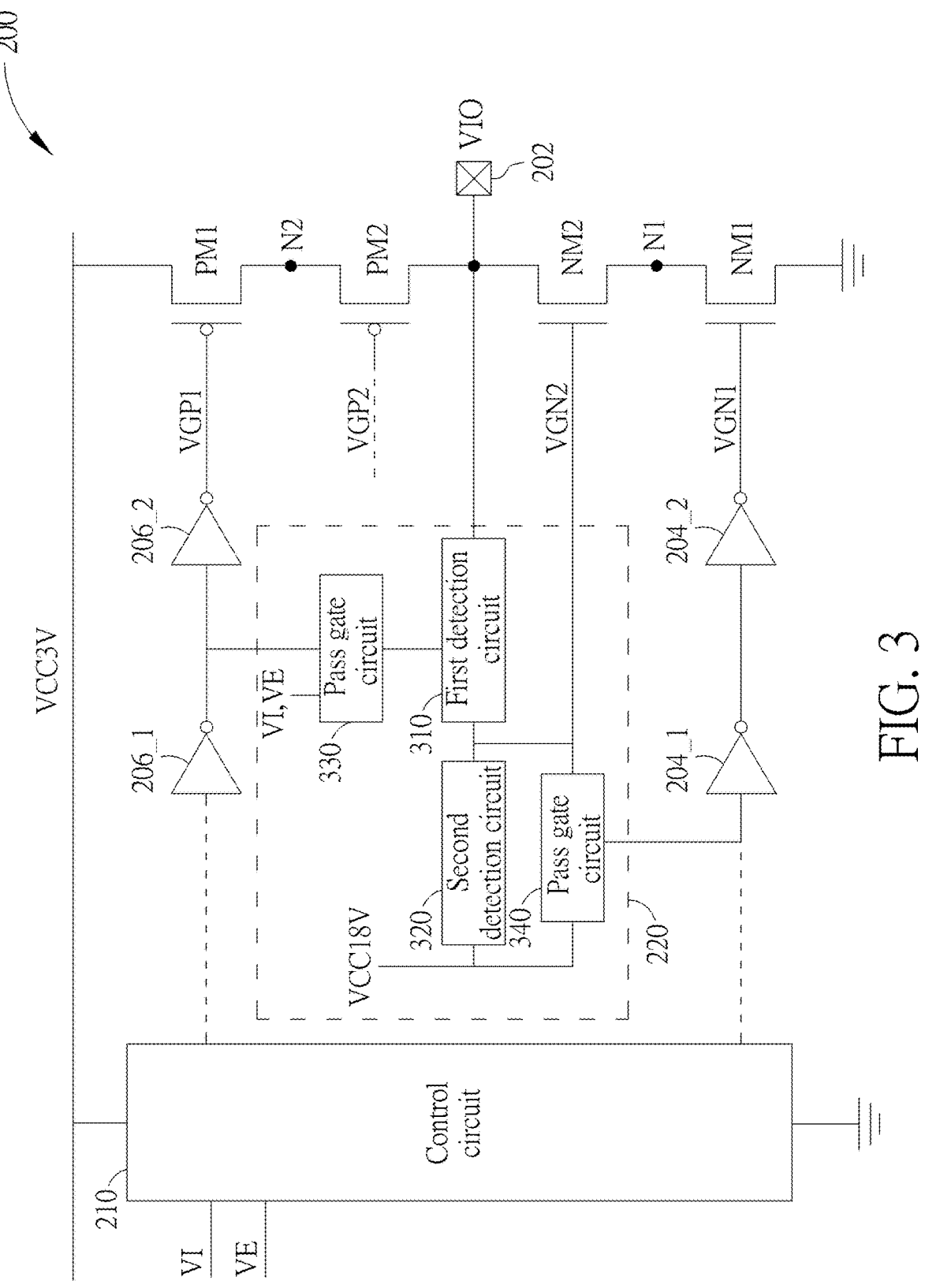
FIG. 3 is a diagram illustrating a tracking circuit according to an embodiment of the present invention.

FIG. 3 is a diagram illustrating a tracking circuit 220 according to an embodiment of the present invention. As shown in FIG. 3, the tracking circuit 220 includes a first detection circuit 310, a second detection circuit 320, and two pass gate circuits 330 and 340. When the control signal VI is changed from the logical value "1" to the logical value "0", the control circuit 210 may start to generate the gate control signals VGP1 and VGN1 in order to turn off the P-type transistor PM1 and turn on the N-type transistor NM1. At this moment, the first detection circuit 310 may detect the voltage level of the output signal VIO, and regard the output signal VIO as the gate control signal VGN2 when the voltage level of the output signal VIO is greater than a first threshold value, for controlling the N-type transistor NM2. Since the N-type transistor NM2 has a high voltage level (e.g., a voltage level close to 3.3V) at this moment, the N-type transistor NM2 will be turned on in order to decrease the voltage level of the output signal VIO. The second detection circuit 320 may detect the voltage level of the output signal VIO, and regard the reference voltage VCC18V (e.g., 18V) as the gate control signal VGN2 when the voltage level of the output signal VIO is less than a second threshold value, for controlling the N-type transistor NM2. In this embodiment, the first threshold value is greater than the reference voltage VCC18V, and the second threshold value is less than the reference voltage VCC18V. For example, the first threshold value may be the reference voltage VCC18V plus a threshold value of the N-type transistor NM2 (e.g., 1.8V+0.6V), and the second threshold value may be the reference voltage VCC18V minus the threshold value of the N-type transistor NM2 (e.g., 1.8V– 0.6V).

In addition, the pass gate circuit 330 may be arranged to control the first detection circuit 310 according to the control signals VE, VI, or EH, in order to be suitable for different modes. In an embodiment, when the control signal VE corresponds to the logical value "1", the pass gate circuit 330 may provide an output of the inverter 206_1 to the first detection circuit 310. When the control signal VE corresponds to the logical value "1", and the control signal VI corresponds to the logical value "0", the pass gate circuit 330 may provide a control voltage with 1.8V to the first detection circuit 310. When the control signal VE corresponds to the logical value "1", and the control signal VI corresponds to the logical value "1", the pass gate circuit 330 may provide a control voltage with 3.3V to the first detection circuit 310. In addition, the pass gate circuit 340 may selectively regard the reference voltage VCC18V as the gate control signal VGN2 according to the gate control signal VGN1, in order to be suitable for different modes. It should be noted that the pass gate circuits 330 and 340 are optional components; that is, if the output buffer 200 only needs to operate in the normal mode without operating in other modes (e.g., an open-source mode), the pass gate circuits 330 and 340 can be removed from FIG. 3.

Figure 4:
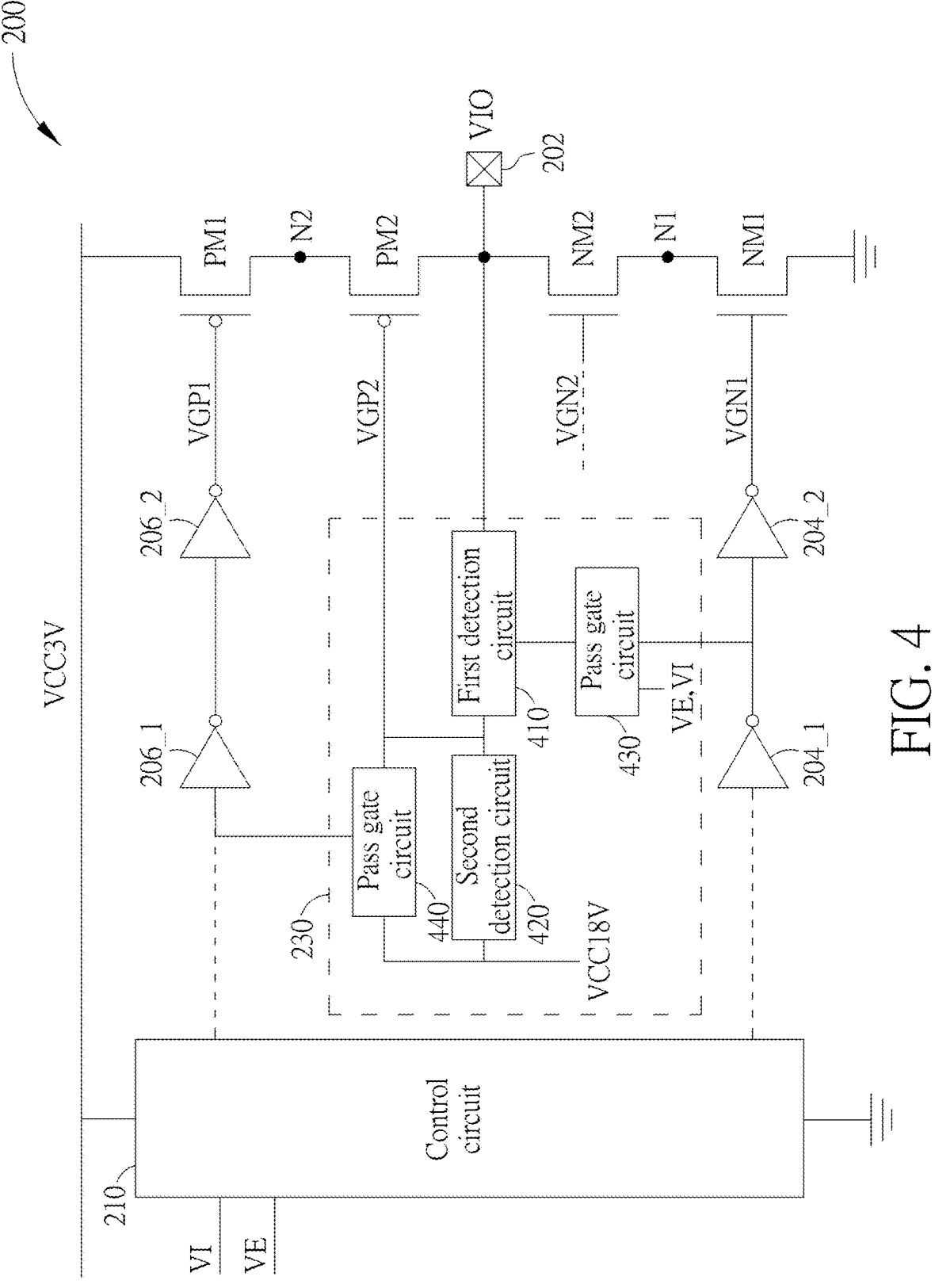
FIG. 4 is a diagram illustrating a tracking circuit according to an embodiment of the present invention.

FIG. 4 is a diagram illustrating a tracking circuit 230 according to another embodiment of the present invention. As shown in FIG. 4, the tracking circuit 230 includes a first detection circuit 410, a second detection circuit 420, and two pass gate circuits 430 and 440. When the control signal VI is changed from the logical value "0" to the logical value "1", the control circuit 210 may start to generate the gate control signals VGP1 and VGN1 in order to turn on the P-type transistor PM1 and turn off the N-type transistor NM1. At this moment, the first detection circuit 410 may detect the voltage level of the output signal VIO, and regard the output signal VIO as the gate control signal VGP2 when the voltage level of the output signal VIO is less than a first threshold value, for controlling the P-type transistor PM2. Since the P-type transistor PM2 has a low voltage level (e.g., a voltage level close to 0V) at this moment, the P-type transistor PM2 will be turned on in order to increase the voltage level of the output signal VIO. The second detection circuit 420 may detect the voltage level of the output signal VIO, and regard the reference voltage VCC18V (e.g., 18V) as the gate control signal VGP2 when the voltage level of the output signal VIO is greater than a second threshold value, for controlling the P-type transistor PM2. In this embodiment, the first threshold value is less than the reference voltage VCC18V, and the second threshold value is greater than the reference voltage VCC18V. For example, the first threshold value may be the reference voltage VCC18V minus a threshold value of the P-type transistor PM2 (e.g., 1.8V–0.6V), and the second threshold value may be the reference voltage VCC18V plus the threshold value of the P-type transistor PM2 (e.g., 1.8V+0.6V).

In addition, the pass gate circuit 430 may be arranged to control the first detection circuit 410 according to the control signals VE, VI, or EH, in order to be suitable for different modes. In an embodiment, when the control signal VE corresponds to the logical value "1", the pass gate circuit 430 may provide an output of the inverter 204_1 to the first detection circuit 410. When the control signal VE corresponds to the logical value "1", and the control signal VI corresponds to the logical value "0", the pass gate circuit 430 may provide a control voltage with 0V to the first detection circuit 410. When the control signal VE corresponds to the logical value "1", and the control signal VI corresponds to the logical value "1", the pass gate circuit 430 may provide a control voltage with 1.8V to the first detection circuit 410. In addition, the pass gate circuit 440 may selectively regard the reference voltage VCC18V as the gate control signal VGP2 according to the gate control signal VGP1, in order to be suitable for different modes. It should be noted that the pass gate circuits 430 and 440 are optional components; that is, if the output buffer 200 only needs to operate in the normal mode without operating in other modes (e.g., an open-drain mode), the pass gate circuits 430 and 440 can be removed from FIG. 4.

Figure 5:
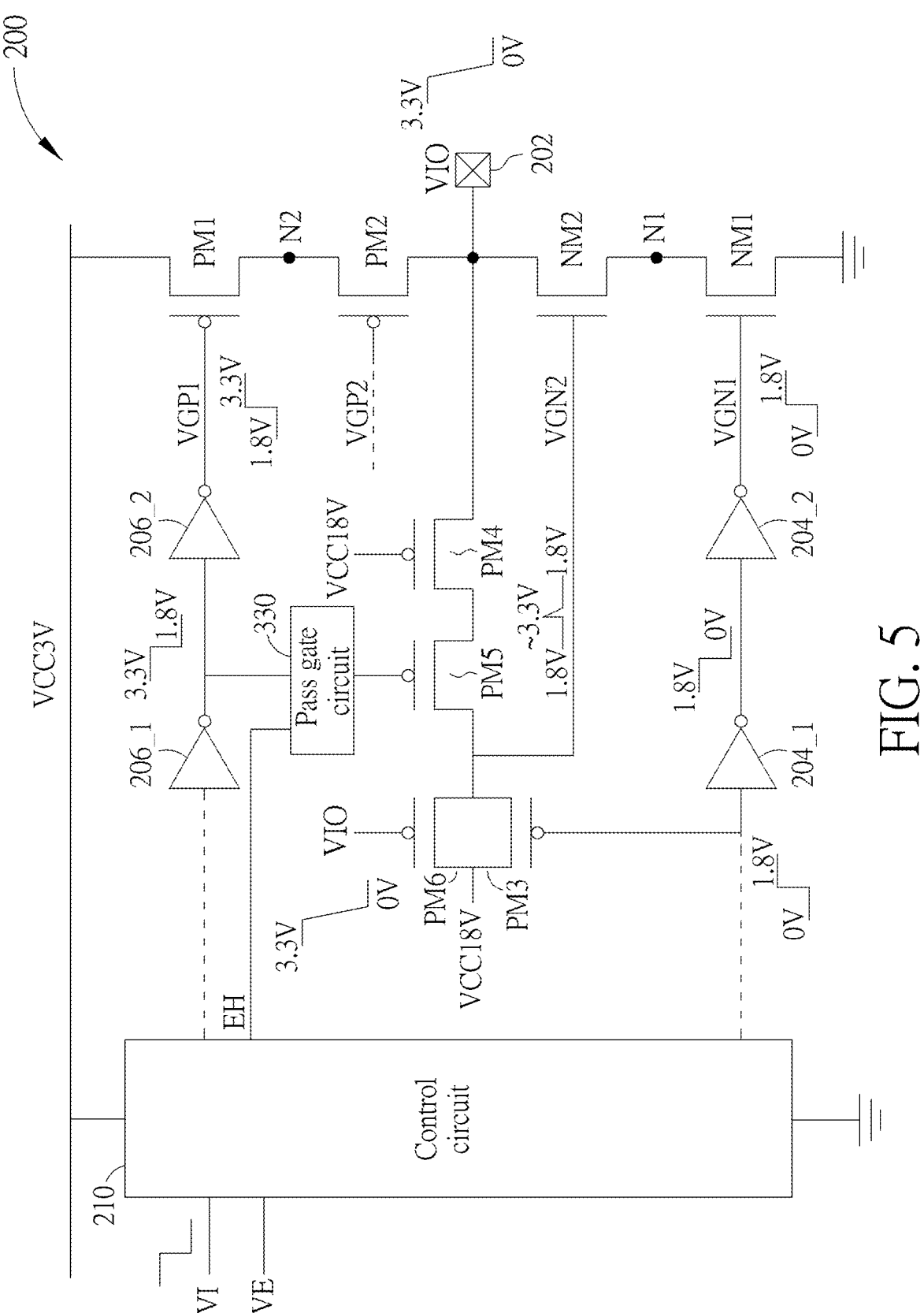
FIG. 5 is a diagram illustrating detailed circuits of a tracking circuit according to an embodiment of the present invention.

FIG. 5 is a diagram illustrating detailed circuits of a tracking circuit 220 according to an embodiment of the present invention. Refer to FIG. 5 in conjunction with FIG. 3. The first detection circuit 310 is implemented by P-type transistors PM4 and PM5, wherein a gate terminal of the P-type transistor PM4 is coupled to the reference voltage VCC18V, a source terminal of the P-type transistor PM4 is coupled to the pad 202, a gate terminal of the P-type transistor PM5 is controlled by an output of the pass gate circuit 330, a source terminal of the P-type transistor PM5 is coupled to a drain terminal of the P-type transistor PM4, and a drain terminal of the P-type transistor PM5 is coupled to a gate terminal of the N-type transistor NM2. The second detection circuit 320 is implemented by a P-type transistor PM6, wherein a gate terminal of the P-type transistor PM6 is controlled by the output signal VIO, a source terminal of the P-type transistor PM6 is coupled to the reference voltage VCC18V, and a drain terminal of the P-type transistor PM6 is coupled to the gate terminal of the N-type transistor NM2. The pass gate circuit 340 is implemented by a P-type transistor PM3, wherein a gate terminal of the P-type transistor PM3 is controlled by the gate control signal VGN1, a source terminal of the P-type transistor PM3 is coupled to the reference voltage VCC18V, and a drain terminal of the P-type transistor PM3 is coupled to the gate terminal of the N-type transistor NM2.

In this embodiment, when the control signal VE has the logical value "1" and the control signal VI is changed from the logical value "1" to the logical value "0", the control circuit 210 may start to generate the gate control signals VGP1 and VGN1 in order to turn off the P-type transistor PM1 and turn on the N-type transistor NM1, wherein the gate control signal VGP1 is switched from 1.8V to 3.3V, and the gate control signal VGN1 is switched from 0V to 1.8V. At this moment, the pass gate circuit 330 may output a voltage of 1.8V to the P-type transistor PM5 according to the control signals VE, VI, or EH. In addition, the P-type transistors PM3 and PM6 will be turned off such that the N-type transistor NM2 will not receive the reference voltage VCC18V (the gate control signal VGN2 is temporarily at 1.8V at this moment). When the voltage level of the output signal VIO is greater than the first threshold value (e.g., the reference voltage plus a threshold value of the P-type transistor PM5), the P-type transistors PM4 and PM5 will start to be turned on, the output signal VIO is regarded as the gate control signal VGN2 in order to turn on the N-type transistor NM2, and the voltage level of the output signal VIO starts to decrease at this moment. When the voltage level of the output signal VIO is less than the second threshold value (e.g., the reference voltage minus a threshold value of the P-type transistor PM6), the P-type transistor PM6 will start to be turned on, and the reference voltage VCC18V is regarded as the gate control signal VGN2 in order to make the drain-source voltages of the N-type transistors NM1 and NM2 less than the nominal voltage.

When the control circuit 210 generates the gate control signals VGP1 and VGN1 in preparation for switching the output signal VIO from a high voltage level to a low voltage level, the gate control signal VGN2 is generated according to the output signal VIO in order to quickly turn on the N-type transistor NM2, such that the N-type transistor NM2 can be turned on without waiting for the voltage level at the node N1 to decrease. In this way, the problems of the gate oxide breakdown or the hot carrier injection over time caused by the drain-source voltage of the N-type transistor NM2 briefly exceeding the nominal voltage can be avoided.

Figure 6:
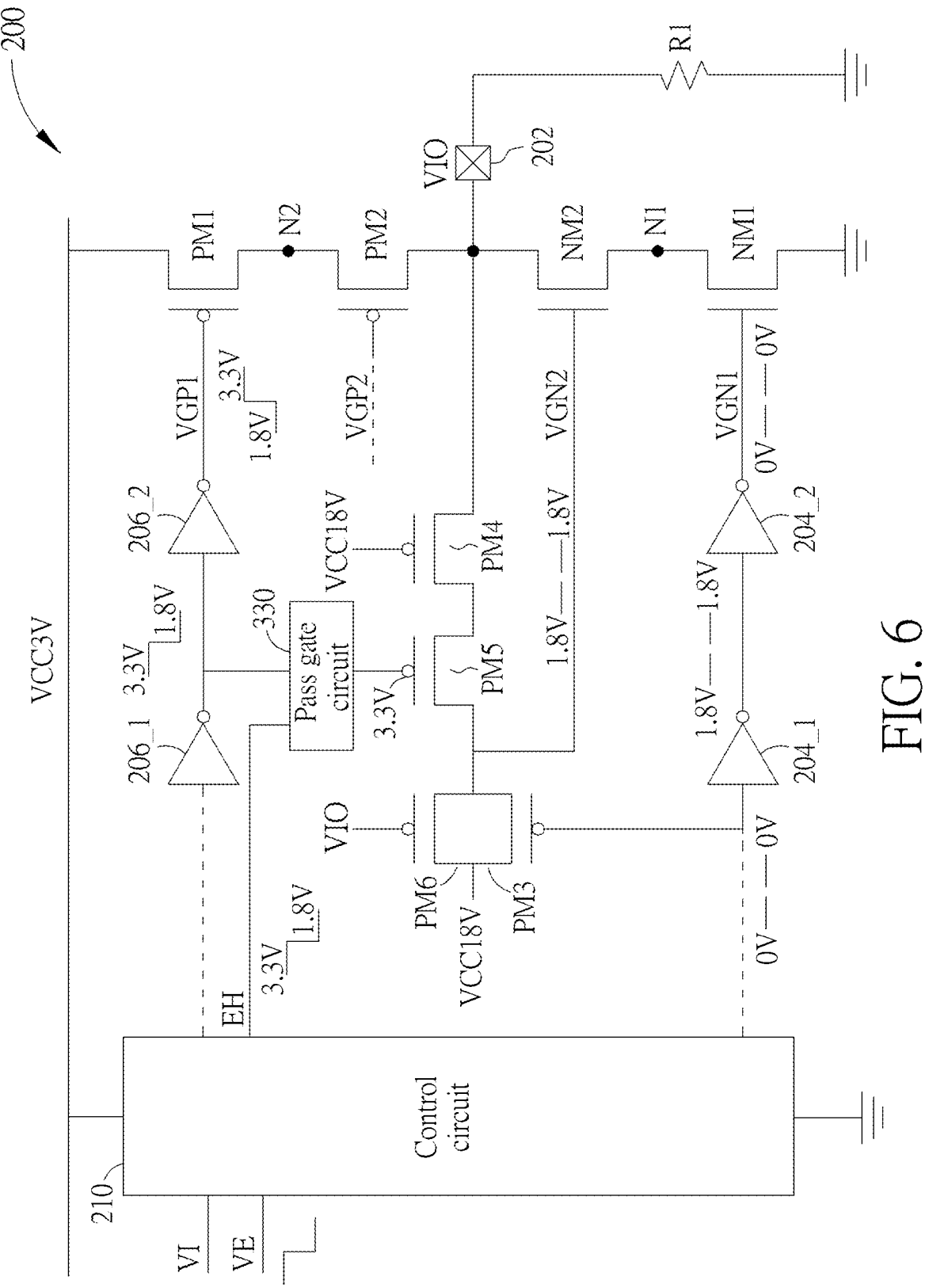
FIG. 6 is a diagram illustrating operations of a tracking circuit when an output buffer operates in an open-source mode according to an embodiment of the present invention.

FIG. 6 is a diagram illustrating operations of the tracking circuit 220 when the output buffer 200 operates in an open-source mode according to an embodiment of the present invention. In the open-source mode, the gate control signal VGN1 is maintained at 0V in order to keep the N-type transistor NM1 turned off, the P-type transistor PM3 is always turned on in order to maintain the gate control signal VGN2 at 1.8V, and the voltage level of the pad 202 is pulled down through a pull-down resistor R1. When the control signal VI has the logical value "1" and the control signal VE is changed from the logical value "1" to the logical value "0", the control circuit 210 may start to generate the gate control signal VGP1 in order to turn off the P-type transistor PM1, wherein the gate control signal VGP1 is switched from 1.8V to 3.3V. At this moment, the pass gate circuit 330 may output a voltage of 3.3V to the P-type transistor PM5 according to the control signals VE, VI, or EH, such that the P-type transistor PM5 will be turned off, and the gate terminal of the N-type transistor NM2 will not receive the output signal VIO.

As shown in FIG. 6, the design of the tracking circuit 220 may also be applied to the open-source mode, and the drain-source voltage of the N-type transistor NM2 will not exceed the nominal voltage when the output buffer 200 is operating.

Figure 7:
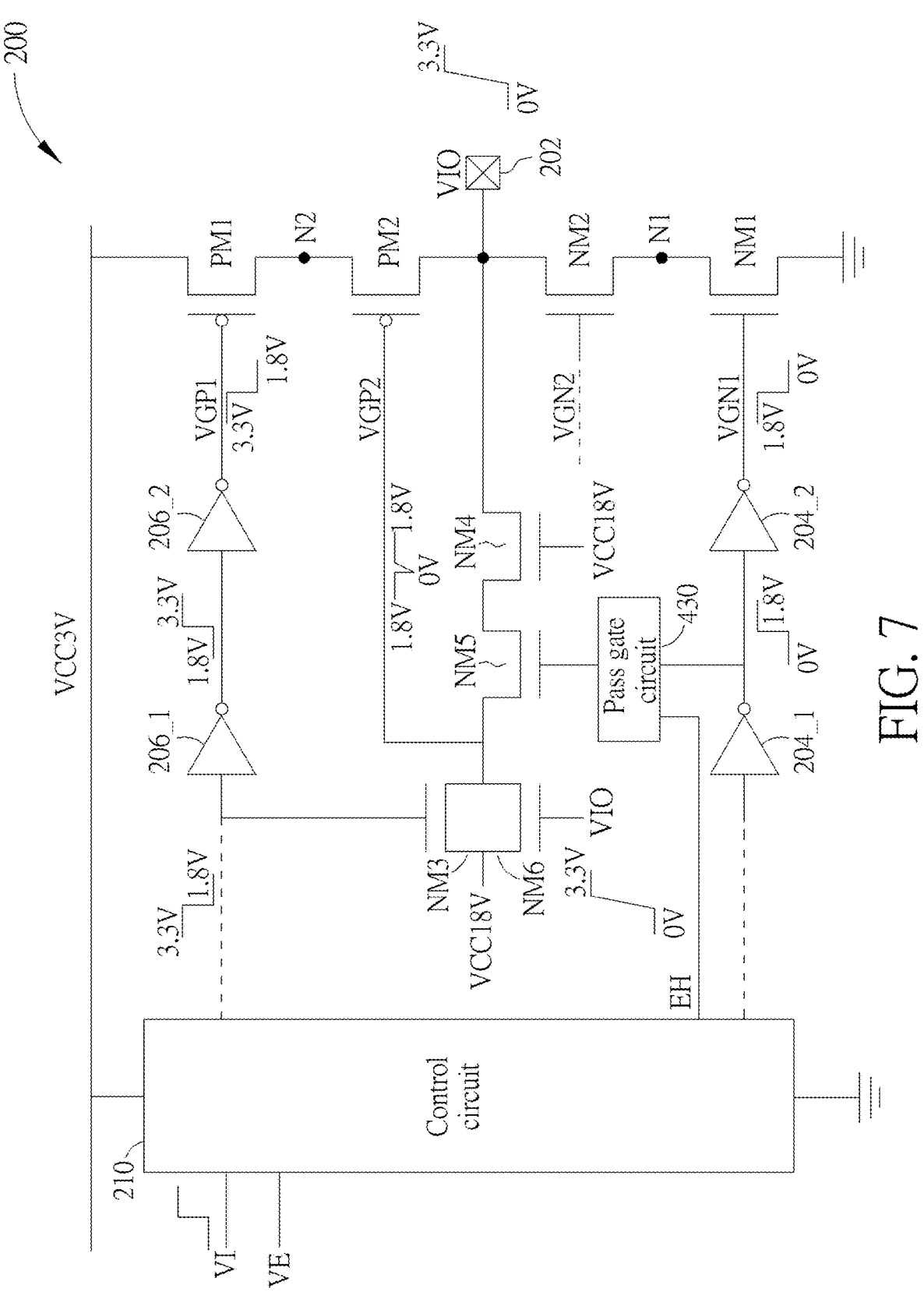
FIG. 7 is a diagram illustrating detailed circuits of a tracking circuit according to an embodiment of the present invention.

FIG. 7 is a diagram illustrating detailed circuits of the tracking circuit 230 according to an embodiment of the present invention. Refer to FIG. 7 in conjunction with FIG. 4. The first detection circuit 410 is implemented by N-type transistors NM4 and NM5, wherein a gate terminal of the N-type transistor NM4 is coupled to the reference voltage VCC18V, a drain terminal of the N-type transistor NM4 is coupled to the pad 202, a gate terminal of the N-type transistor NM5 is controlled by an output of the pass gate circuit 430, a drain terminal of the N-type transistor NM5 is coupled to a source terminal of the N-type transistor NM4, and a source terminal of the N-type transistor NM5 is coupled to a gate terminal of the P-type transistor PM2. The second detection circuit 420 is implemented by an N-type transistor NM6, wherein a gate terminal of the N-type transistor NM6 is controlled by the output signal VIO, a drain terminal of the N-type transistor NM6 is coupled to the reference voltage VCC18V, and a source terminal of the N-type transistor NM6 is coupled to the gate terminal of the P-type transistor PM2. The pass gate circuit 440 is implemented by an N-type transistor NM3, wherein a gate terminal of the N-type transistor NM3 is controlled by the gate control signal VGP1, a drain terminal of the N-type transistor NM3 is coupled to the reference voltage VCC18V, and a source terminal of the N-type transistor NM3 is coupled to the gate terminal of the P-type transistor PM2.

In this embodiment, when the control signal VE has the logical value "1" and the control signal VI is changed from the logical value "0" to the logical value "1", the control circuit 210 may start to generate the gate control signals VGP1 and VGN1 in order to turn on the P-type transistor PM1 and turn off the N-type transistor NM1, wherein the gate control signal VGP1 is switched from 3.3V to 1.8V, and the gate control signal VGN1 is switched from 1.8V to 0V. At this moment, the pass gate circuit 430 may output a voltage of 1.8V to the N-type transistor NM5 according to the control signals VE, VI, or EH. In addition, the N-type transistors NM3 and NM6 will be turned off such that the P-type transistor PM2 will not receive the reference voltage VCC18V (the gate control signal VGP2 is temporarily at 1.8V at this moment). When the voltage level of the output signal VIO is less than the first threshold value (e.g., the reference voltage minus a threshold value of the N-type transistor NM5), the N-type transistors NM4 and NM5 will start to be turned on, the output signal VIO is regarded as the gate control signal VGP2 in order to turn on the P-type transistor PM2, and the voltage level of the output signal VIO starts to increase at this moment. When the voltage level of the output signal VIO is greater than the second threshold value (e.g., the reference voltage plus a threshold value of the N-type transistor NM6), the N-type transistor NM6 will start to be turned on, and the reference voltage VCC18V is regarded as the gate control signal VGP2 in order to make the drain-source voltages of the P-type transistors PM1 and PM2 less than the nominal voltage.

When the control circuit 210 generates the gate control signals VGP1 and VGN1 in preparation for switching the output signal VIO from a low voltage level to a high voltage level, the gate control signal VGP2 is generated according to the output signal VIO in order to quickly turn on the P-type transistor PM2, such that the P-type transistor PM2 can be turned on without waiting for the voltage level at the node N2 to increase. In this way, the problems of the gate oxide breakdown or the hot carrier injection over time caused by the drain-source voltage of the P-type transistor PM2 briefly exceeding the nominal voltage can be avoided.

Figure 8:
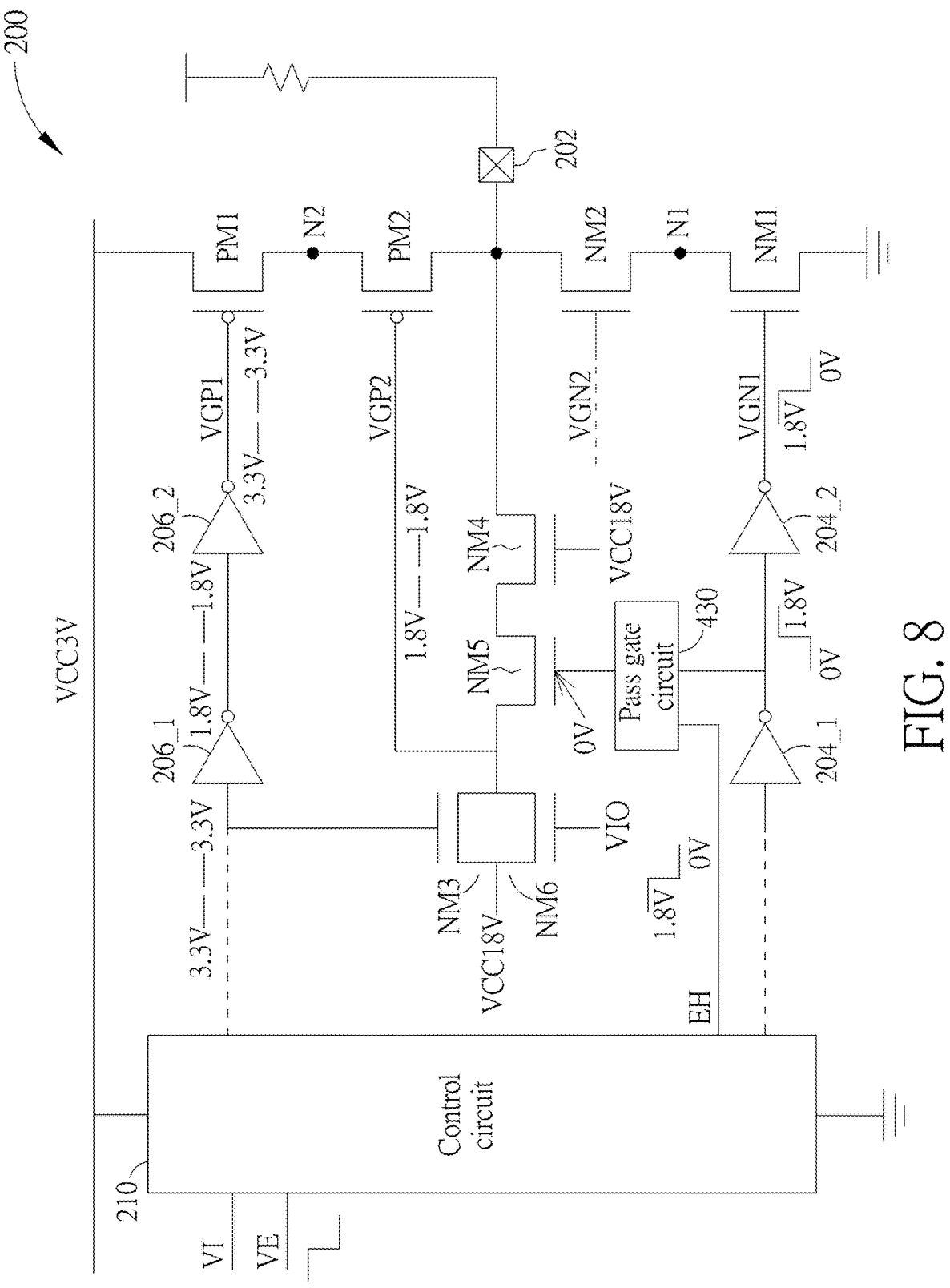
FIG. 8 is a diagram illustrating operations of a tracking circuit when an output buffer operates in an open-drain mode according to an embodiment of the present invention.

FIG. 8 is a diagram illustrating operations of the tracking circuit 230 when the output buffer 200 operates in an open-drain mode according to an embodiment of the present invention. In the open-drain mode, the gate control signal VGP1 is maintained at 3.3V in order to keep the P-type transistor PM1 turned off, the N-type transistor NM3 is always turned on in order to maintain the gate control signal VGP2 at 1.8V, and the voltage level of the pad 202 is pulled up through a pull-up resistor R2. When the control signal VI has the logical value "0" and the control signal VE is changed from the logical value "1" to the logical value "0", the control circuit 210 may start to generate the gate control signal VGN1 in order to turn off the N-type transistor NM1, wherein the gate control signal VGN1 is switched from 1.8V to 0V. At this moment, the pass gate circuit 430 may output a voltage of 0V to the N-type transistor NM5 according to the control signals VE, VI, or EH, such that the N-type transistor NM5 will be turned off, and the gate terminal of the P-type transistor PM2 will not receive the output signal VIO.

As shown in FIG. 8, the design of the tracking circuit 230 may also be applied to the open-drain mode, and the drain-source voltage of the P-type transistor PM2 will not exceed the nominal voltage when the output buffer 200 is operating.

It should be noted that the detailed circuits of the tracking circuits 220 and 230 shown in FIGS. 5-8 are for illustration only, and the present invention is not limited thereto. In some embodiments, the P-type transistors PM3-PM6 and the N-type transistors NM3-NM6 may be replaced by other suitable switching components.

In above embodiments, the purpose of the tracking circuit 220 is to prevent the drain-source voltage of the N-type transistor NM2 from briefly exceeding the nominal voltage, and the purpose of the tracking circuit 230 is to prevent the drain-source voltage of the P-type transistor PM2 from briefly exceeding the nominal voltage. In some embodiment, any of the tracking circuits 220 and 230 may be removed from the output buffer 200. These alternative designs all fall within the scope of the present invention.

The output buffer of the present invention can prevent a drain-source voltage of a transistor from briefly exceeding a nominal voltage, thus solving the issues of the related art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output buffer, comprising:
a first P-type transistor, coupled to a supply voltage;
a second P-type transistor, coupled between the first P-type transistor and a pad, wherein the first P-type transistor and the second P-type transistor selectively connect the supply voltage and the pad, and the pad is arranged to output an output signal of the output buffer;
a first N-type transistor, coupled to a grounding voltage;
a second N-type transistor, coupled between the first N-type transistor and the pad, wherein the first N-type transistor and the second N-type transistor selectively connect the grounding voltage and the pad;
a control circuit, arranged to generate two first gate control signals according to a control signal, in order to control the first P-type transistor and the first N-type transistor; and
a tracking circuit, coupled to the pad, and arranged to generate a second gate control signal according to the output signal, in order to control the second P-type transistor or the second N-type transistor;
wherein when the control circuit generates the two first gate control signals according to the control signal for turning off the first P-type transistor and turning on the first N-type transistor, the tracking circuit generates the second gate control signal according to the output signal for turning on the second N-type transistor.

2. The output buffer of claim 1, wherein when the control circuit generates the two first gate control signals according to the control signal for turning off the first P-type transistor and turning on the first N-type transistor, when a voltage level of the output signal is greater than a first threshold value, the tracking circuit generates the second gate control signal according to the output signal for turning on the second N-type transistor and decreasing the voltage level of the output signal; and when the voltage level of the output signal is less than a second threshold value, the tracking circuit generates the second gate control signal according to a reference voltage for controlling the second N-type transistor.

3. The output buffer of claim 2, wherein when the control circuit generates the two first gate control signals according to the control signal for turning off the first P-type transistor and turning on the first N-type transistor, when the voltage level of the output signal is greater than the first threshold value, the tracking circuit regards the output signal as the second gate control signal for turning on the second N-type transistor and decreasing the voltage level of the output signal; and when the voltage level of the output signal is less than the second threshold value, the tracking circuit regards the reference voltage as the second gate control signal for controlling the second N-type transistor.

4. The output buffer of claim 2, wherein the first threshold value is greater than the reference voltage, and the second threshold value is less than the reference voltage.

5. The output buffer of claim 1, wherein the tracking circuit is a first tracking circuit; when the control circuit generates the two first gate control signals according to the control signal for turning off the first P-type transistor and turning on the first N-type transistor, the first tracking circuit generates the second gate control signal according to the output signal for turning on the second N-type transistor; and the output buffer further comprises:
a second tracking circuit, coupled to the pad, wherein when the control circuit generates the two first gate control signals according to the control signal for turning on the first P-type transistor and turning off the first N-type transistor, the second tracking circuit generates another second gate control signal according to the output signal for turning on the second P-type transistor.

6. The output buffer of claim 5, wherein when the control circuit generates the two first gate control signals according to the control signal for turning on the first P-type transistor and turning off the first N-type transistor, when a voltage level of the output signal is less than a first threshold value, the second tracking circuit generates the other second gate control signal according to the output signal for turning on the second P-type transistor and increasing the voltage level of the output signal; and when the voltage level of the output signal is greater than a second threshold value, the second tracking circuit generates the other second gate control signal according to a reference voltage for controlling the second P-type transistor.

7. The output buffer of claim 6, wherein when the control circuit generates the two first gate control signals according to the control signal for turning on the first P-type transistor and turning off the first N-type transistor, when the voltage level of the output signal is less than the first threshold value, the second tracking circuit regards the output signal as the other second gate control signal for turning on the second P-type transistor and increasing the voltage level of the output signal; and when the voltage level of the output signal is greater than the second threshold value, the second tracking circuit regards the reference voltage as the other second gate control signal for controlling the second P-type transistor.

8. The output buffer of claim 6, wherein the first threshold value is less than the reference voltage, and the second threshold value is greater than the reference voltage.

9. The output buffer of claim 1, wherein when the control circuit generates the two first gate control signals according to the control signal for turning on the first P-type transistor and turning off the first N-type transistor, the tracking circuit generates the second gate control signal according to the output signal for turning on the second P-type transistor.

* * * * *